United States Patent [19]
Robinson

[11] 4,041,326
[45] Aug. 9, 1977

[54] HIGH SPEED COMPLEMENTARY OUTPUT EXCLUSIVE OR/NOR CIRCUIT

[75] Inventor: Barry J. Robinson, Fremont, Calif.

[73] Assignee: Fairchild Camera and Instrument Corporation, Mountain View, Calif.

[21] Appl. No.: 770,968

[22] Filed: Feb. 22, 1977

Related U.S. Application Data

[63] Continuation-in-part of Ser. No. 704,259, July 12, 1976, abandoned.

[51] Int. Cl.² .............................................. H03K 19/32
[52] U.S. Cl. ............................... 307/216; 307/299 A
[58] Field of Search .......................... 307/216, 299 A; 330/30 D

[56] References Cited

U.S. PATENT DOCUMENTS

| 2,927,733 | 3/1960 | Campbell | 307/216 X |
| 3,040,192 | 6/1962 | Slobodzinski | 307/216 X |
| 3,412,265 | 11/1968 | Cornish | 307/216 X |
| 3,510,681 | 5/1970 | Cooperman | 307/216 X |
| 4,006,365 | 2/1977 | Marzin et al. | 307/216 X |

Primary Examiner—John S. Heyman
Attorney, Agent, or Firm—Alan H. MacPherson; Henry K. Woodward; Norman E. Reitz

[57] ABSTRACT

A very high-speed exclusive OR/NOR circuit in which output function and its complement are propagated simultaneously. Developed particularly for use in integrated circuit applications, the basis circuit uses six NPN transistors in a tree configuration to select one of four mutually exclusive conductive paths which correspond to the four states of the truth table of a two-variable exclusive OR/NOR function.

7 Claims, 6 Drawing Figures

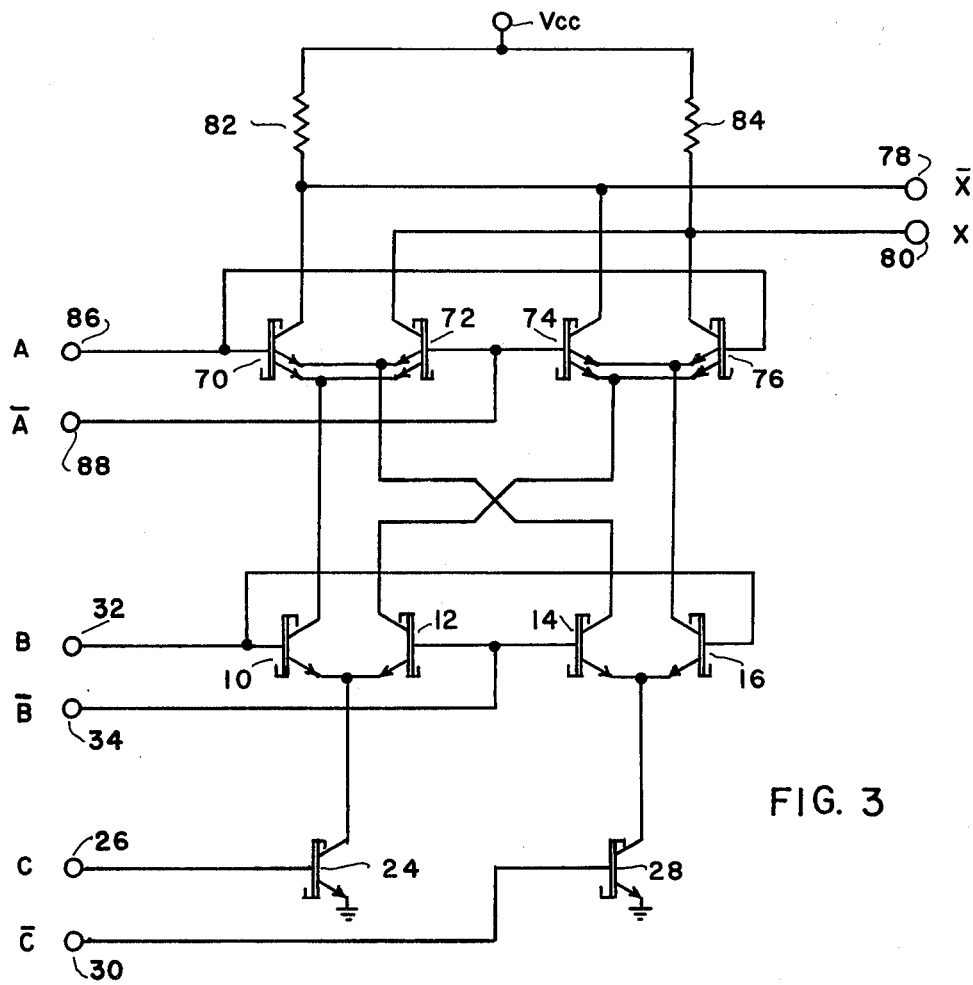
FIG. 3
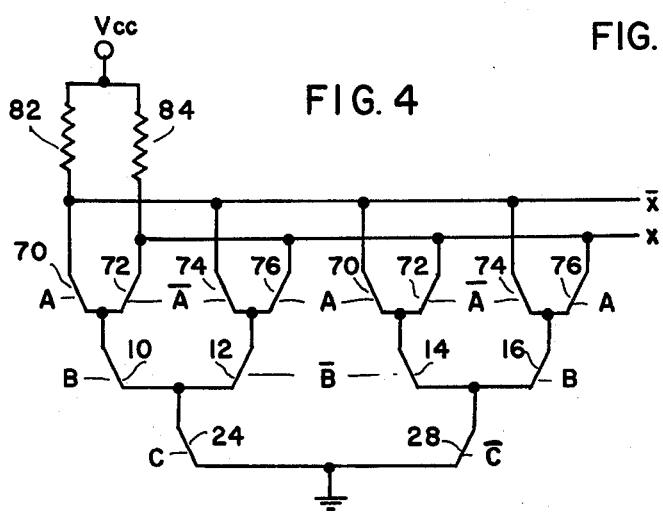
FIG. 4
|   | 0 | 1 | 2 | 3 | 4 | 5 | 6 | 7 |
|---|---|---|---|---|---|---|---|---|
| A | 0 | 1 | 0 | 1 | 0 | 1 | 0 | 1 |
| B | 0 | 0 | 1 | 1 | 0 | 0 | 1 | 1 |
| C | 0 | 0 | 0 | 0 | 1 | 1 | 1 | 1 |
| x | 0 | 1 | 1 | 0 | 1 | 0 | 0 | 1 |
| $\bar{x}$ | 1 | 0 | 0 | 1 | 0 | 1 | 1 | 0 |
FIG. 5
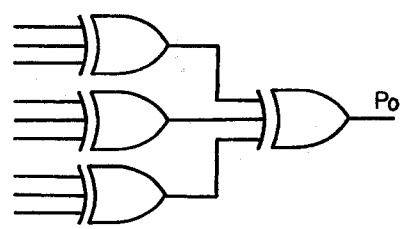
FIG. 6

HIGH SPEED COMPLEMENTARY OUTPUT EXCLUSIVE OR/NOR CIRCUIT

BACKGROUND OF THE INVENTION

This is a continuation-in-part of a copending U.S. patent application of Barry J. Robinson, Ser. No. 704,259, filed July 12, 1976, now abandoned.

Several different circuits exist that accept two or more input variables and produce an exclusive OR output. If an exclusive NOR output is required, it is then a simple matter to feed the exclusive OR output into an inverter. While such circuits may be adequate for many different electronic circuit applications, they do not perform with sufficient speed in many other applications, such as for a high-speed adder to RAM data storage interface, such as may be required in the modern microprocessor circuits. One prior art circuit that simultaneously generates complementary exclusive OR and NOR functions is an ECL circuit that is operated as a differential amplifier in which logical decisions are made at the current source node. This ECL circuit requires four very precise bias sources against which the input variables are compared to open one of four conductive paths that correspond to the four states of the truth table of the two-variable exclusive OR/NOR function. In this circuit the value of certain resistors are critical and, if the resistors are to be integrated with the transistors in an IC, the resistors must be carefully designed and the process carefully controlled to produce resistors that are sufficiently balanced to prevent saturation of the circuit transistors. It is apparent that while the ECL circuits may be adequate for the assembly of circuit boards using discrete components, or for small individual circuits, the precision and therefore costly resistor deposition processes, the requirement for numerous and different bias supply connections, and their inherent high power requirements, make it impossible to use ECL circuitry for compact and efficient packaging, such as that required in MSI or LSI applications.

The T$^2$L exclusive OR/NOR circuit of this invention provides fast simultaneously propagated complementary outputs such as the ECL circuit mentioned above, but suffers few of the latter circuit's limitations. The resistors in the circuit of the invention are not critical because of the use of Schottky clamped transistors, and both high power and low power designs are readily obtained. While the above-mentioned ECL circuit normally uses five separate bias connections, the circuit of the present invention requires only a $V_{cc}$ and ground connections to a power source. Furthermore, the circuit of the invention is easily and readily adaptable for use in integrated circuits for developing very high-speed exclusive OR/NOR logic functions without the need for additional gates or inverter circuits.

Briefly described, the exclusive OR/NOR T$^2$L circuit of the invention employs Schottky NPN transistors in a tree configuration having a plurality of levels, each level controlled by one input variable. A two-input circuit requires two levels, the lowest comprising two transistors with their emitters connected directly to ground and with each collector connected to the interconnected emitters of transistor pairs in the next upper level of the tree. The two transistors in the lower level are enabled by signals representing the two states of one input variable so that one of the two pairs of transistors in the upper level are always enabled. In the upper level, one transistor in each pair is enabled by the true or false of the second input variable so that one, and only one, of the transistors in the upper level are conductive. Appropriately connected collectors of the transistors in the upper level yield both the output function and its complement. By arranging transistors in a three-level tree, with each level corresponding to one of the input variables, eight mutually exclusive conducting paths may be produced which implement the eight states of a three-variable exclusive OR/NOR circuit.

In the drawings that illustrates a preferred embodiment of the invention:

FIG. 3 is a schematic diagram of a three-level three-input variable T$^2$L exclusive OR/NOR circuit;

FIG. 4 is a simplified circuit diagram of the schematic diagram of FIG. 3 illustrating the various current paths;

FIG. 5 is a truth table for the exclusive OR/NOR circuit of FIGS. 3 and 4; and

FIG. 6 is a logic diagram showing four of the circuits of FIG. 3 connected into a nine-bit parity checking circuit.

Figure 1:
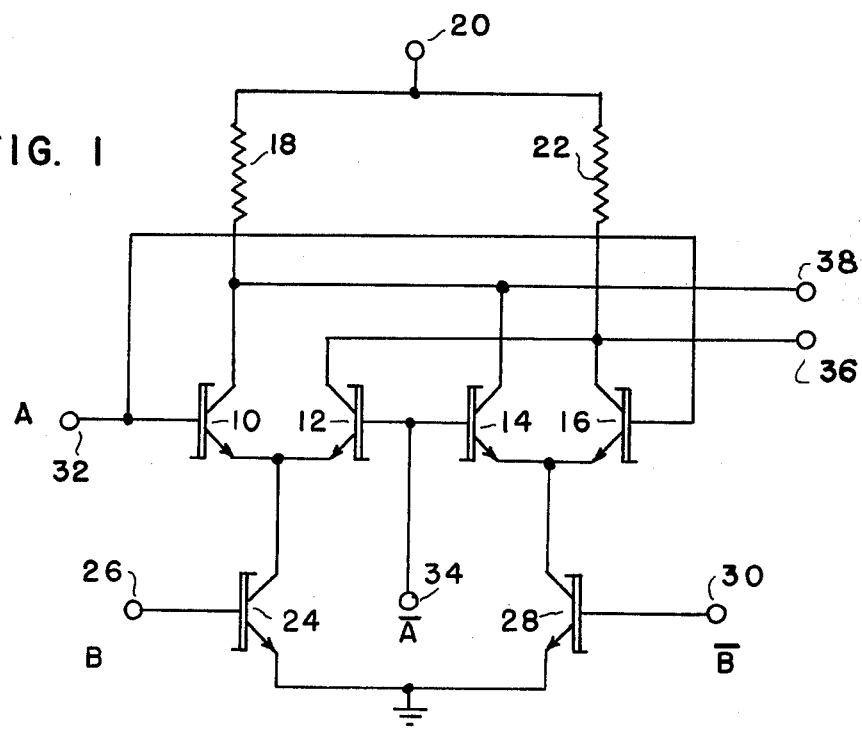
FIG. 1 is a schematic diagram of a preferred embodiment of a two-level, two-input exclusive OR/NOR circuit for the invention.

The T$^2$L circuitry illustrated in the schematic diagram of FIG. 1 develops very high-speed exclusive OR/NOR logic functions with the unique property that the output function and its complement are propagated virtually simultaneously. Although the circuit may assume somewhat modified forms dictated by the input and output requirements, the circuitry remains such that its operation is always dependent upon four mutually exclusive conducting paths which correspond to the four states of the truth table of the two-variable exclusive OR/NOR functions.

In the schematic diagram of FIG. 1 are two pairs of NPN Schottky transistors 10, 12 and 14, 16. The collectors of transistors 10 and 14 are connected together and are coupled through a resistance 18 to a source of positive voltage 20. Similarly, the collectors of transistors 12 and 16 are connected together and coupled through a resistance 22 to the positive voltage source 20. The exclusive NOR output is taken from the collectors of transistors 12 and 16, and the exclusive OR output is taken from the collectors of transistors 10 and 14.

The emitters of transistors 10 and 12 are connected together and to the collector of an NPN Schottky transistor 24, the emitter of which is connected directly to ground and the base of which is connected to the input terminal 26. Similarly, the emitters of transistors 14 and 16 are connecter together and to the collector of the NPN transistor 28, the emitter of which is connected to ground and the base of which is connected to the input terminal 30. Input terminal 26 coupled to the base of transistor 24 receives the true value of one of the input variables, while the input terminal 30 is to receive the inverted or false input of that same input variable.

The base of transistor 10 is connected to the base of transistor 16 and also to the input terminal 32 which is to receive the true value of the second input variable. Similarly, the base of transistor 12 is coupled to the base of transistor 14 and to the input terminal 34 which receives the false or inverted input of that variable.

The operation of circuitry of FIG. 1 is straightforward. With the circuitry connected only to the voltage source 20 and to ground, there is no conduction through any transistors and the voltage level appearing at the output terminals 36 and 38 will be the same as that of the voltage source 20, or at its "high" state. However, when selected transistors are on and there is conduction of current between the current source 20 and ground through, for example, the resistance 18, then the signal level at the output terminal 36 is near ground potential and is in its "low" state. Thus, when the signal "B" at input terminal 26 is high, transistor 24 is conductive; then a high signal "A" at input terminal 32 will render transistor 10 conductive and the current path from current source 20 through resistance 18, transistor 10 and transistor 24 to ground, will produce a low output signal at terminal 36. When signal A at input terminal 32 goes low, then the inverted signal at input terminal 34 will go high, transistor 12 conducts, and a low output signal appears at the output terminal 38. The operation is similar with respect to conduction through transistor 28. When a "not B" signal is applied to input terminal 30 to render transistor 28 conductive, a positive A signal at input terminal 32 will produce a low output at terminal 38, and a positive "not A" signal at input terminal 34 will produce a low output signal at terminal 36.

The basic circuit described above is useable with drive circuits which produce both of the variables with their logical complements. In many instances, the exclusvie OR/NOR is to be driven by a circuit having only the variables but not their complements. If such is the case, the T²L circuit of FIG. 2 illustrates a preferred embodiment of circuitry, including the circuitry of FIG. 1, for producing exclusive OR/NOR functions with only two input signals, A and B, without their complements.

Figure 2:
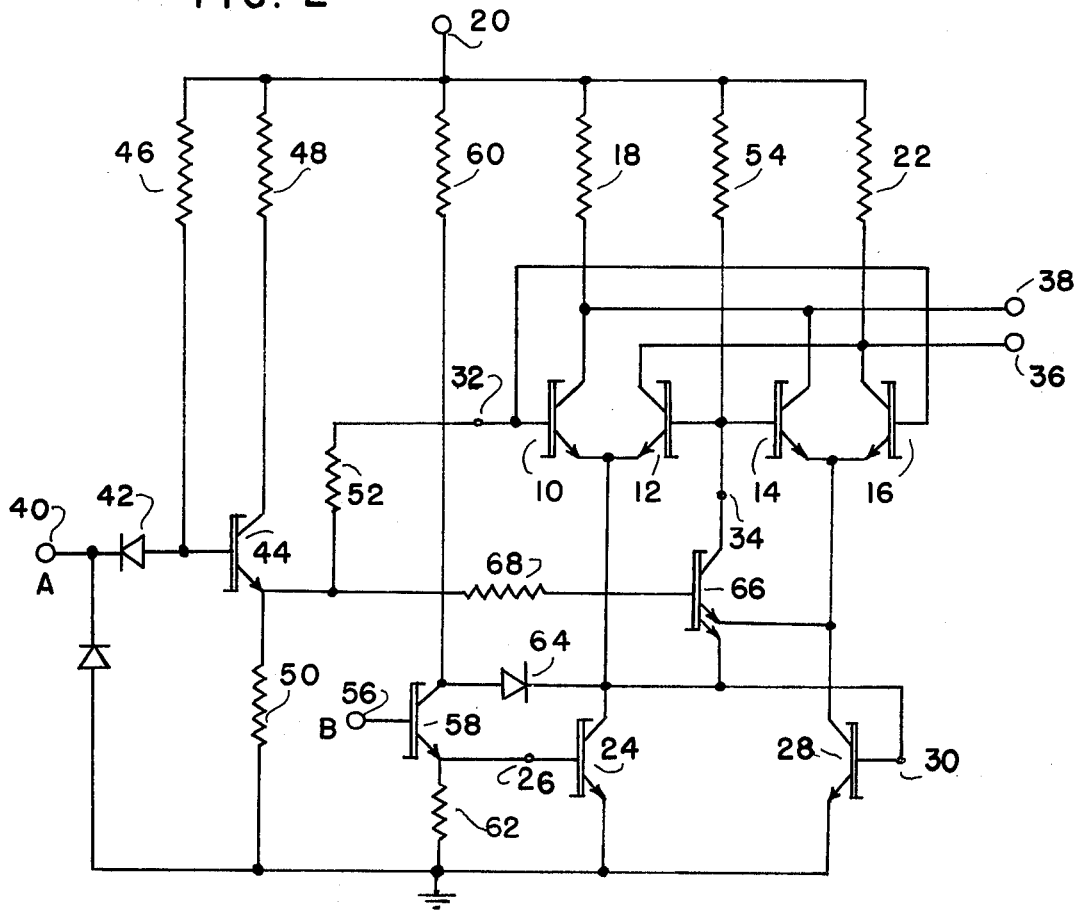
FIG. 2 is a schematic diagram showing the circuit of FIG. 1 together with additional high-speed T$^2$L input interface circuitry.

In the schematic diagram of FIG. 2, the circuitry of FIG. 1 has been included using the same reference numerals as used in FIG. 1. In FIG. 2, the input signal A is applied to a terminal 40 which is connected to the cathode of diode 42, the anode of which is connected to the base of an NPN Schottky transistor 44 and through resistance 46 to the current source 20. The collector of transistor 44 is also coupled to the current source 20 through a resistance 48. The emitter of transistor 44 is coupled through a resistor 50 to ground and is also coupled through a resistance 52 to the input terminal 32 that introduces the A signal to the exclusive OR/NOR circuit.

The emitter of transistor 44 is also coupled through a resistor 68 to the base of a multiple emitter Schottky transistor 66. The emitters of transistor 66 are coupled to the collectors of the transistors 26 and 28, as will be subsequently described, and the collector of transistor 66 is connected to the not A input terminal 34.

In operation, if the signal input at terminal 40 is low, the base of transistor 44 is also low and the transistor is non-conductive. Therefore, the emitter of transistor 44 is near ground potential which is reflected at the input terminal 32 to cut off conduction of transistor 10. With transistor 44 non-conductive, the transistor 66 is also non-conductive and the input terminal 34, which is coupled to the positive current source 20 through resistor 54, is therefore high. When a high input signal is applied to the terminal A, transistor 44 conducts and its emitter is raised above ground potential. This high state is applied to the input terminal 32 of the exclusive OR/-NOR circuit and also to the base of transistor 66 to render it conductive. Since one of the emitters of transistor 66 is always coupled to ground through either transistor 24 or 28, conduction of ransistor 66 will place the not A input terminal 34 in its low state. Thus, when the input signal at terminal 40 is high, it is also high at terminal 32 and low at terminal 34 of the OR/NOR circuit.

The B input signal is applied to the input terminal 56 of the NPN Schottky transistor 58, the collector of which is connected through a resistance 60 to the current source 20 and the emitter which is connected through a resistance 62 to ground. The emitter of transistor 58 is also coupled to the not B input terminal 30 of the exclusive OR/NOR circuit; the collector is coupled to the anode of a diode 64, the cathode of which is connected to the collector of transistor 28, the B input terminal 26 that is coupled to the base of transistor 24, and to one emitter of the multiple emitter NPN Schottky transistor 66.

When the B input at terminal 56 is low, the transistor 58 is non-conductive and the emitter of transistor 58 is approximately at ground potential to render the transistor 28 non-conductive. With the signal at terminal 56 low, the collector of transistor 58 is at the high current source potential so that the base transistor 24 is also high to render transistor 24 conductive. When the input signal B at terminal 56 is high, transistor 58 is conductive and the base of transistor 28 goes high to render that transistor conductive. When transistor 28 is conductive, its collector approaches ground potential and, since the base of transistor 24 is coupled to the collector of transistor 28, transistor 24 becomes, non-conductive It will be noted that one of the emitters of the multi-emitter transistor 66 will always be at a positive potential while the other emitter is low. It will also be noted that the transistor 66 serves to instantly lower any potential at the input terminal 34 when the transistor 66 is made conductive by the presence of a high A signal at the input terminal 40 and the presence of a high A signal at the input terminal 40 and the consequent high value at the emitter or transistor 44.

The T²L exclusive OR/NOR circuits of FIGS. 1 and 2 may be expanded to provide a third level for accommodating three input variables that are necessary for use in circuits such as the high speed nine-bit parity circuits shown in FIG. 6. FIG. 3 is a schematic diagram illustrating such a three-level tree in which the collectors of the two pairs of NPN Schottky transistors 10, 12 and 14, 16 are coupled to the emitters of four pairs of Schottky transistors which may be comprised of two pairs of dual emitter transistors 70, 72 and 74, 76. As illustrated in the FIGURE, the first emitter of transistor 70 is coupled to the first emitter of transistor 72 and both are connected to the collector of transistor 10.Similarly, the second emitters of transistors 70 and 72 are coupled together and to the collector of transistor 14. In a like fashion, the first emitters of transistors 74 and 76 are intercoupled and connected to the collector of transistor 12 while the second emitters of transistors 74 and 76 are intercoupled and connected to the collector of transistor 16. The collectors of transistors 70 and 74 are connected together and to the circuit's true output terminal 78 and the collectors of transistors 72 and 76 are connected together and to the circuit 3 S inverted or false output terminal 80. The collectors of transistors 70 and 74 are connected to a $V_{cc}$ source of typically five volts through a resistance 82, while the collectors of transistors 72 and 76 are connected to the $V_{cc}$ source through a similar resistance 84. The bases of the transistors 70 and 76 are interconnected and coupled to the input terminal 86 of the output variable A, while the bases of transistors 72 and 74 are connected together and to the input terminal 88 of the input variable "$\overline{A}$." It will be noted that the bases of transistors 10 and 16 are connected to the input terminal 32 which now receives the true value of the input variable B, and the base of transistors 12 and 14 are connected to receive the "$\overline{B}$" input signal at terminal 34. Similarly, the base of transistors 24 and 28 that are respectively coupled to the terminals 26 and 30 now receive the input variables "$\overline{C}$" and "C," respectively.

The circuits illustrated in FIG. 3 is repeated in FIG. 4 in a very simplified form to facilitate an understanding of the operation of the circuit. In the simplified drawing of FIG. 4, the various transistor "switches" in the three levels are shown as diagonal lines with an adjacent letter indicating the input variable that "closes" that particular switch. For example, an input signal of a binary "III" would enable the A transistors 70 and 76 in the top level, the B transistors 10 and 16 in the second level and only the C transistor 24 at the lower level. The enabling of transistor C thereby enables the left branch of the circuit, the enabling of transistor 10 in the left branch selects the left branch of the center level, and the enabling of the transistor 70 in the left branch of the second level permits the passage of current from the $V_{cc}$ source through the resistance 82 and transistors 70, 10 and 24 directly to ground. The output terminal 78, which is at a normally high level without such a conduction, now drops to its low output level.

FIG. 5 is a positive logic truth table for a three-input variable exclusive OR/NOR circuit showing, for example, that the previously described input of a binary 7, III, will produce a binary "0" at the $\overline{X}$ output 78 and a binary "1" at the X output 80. Assume another input signal of a binary "110" is applied to the input terminals of the circuit. As illustrated in FIG. 5, an input signal of 110 produces a high output at the $\overline{X}$ output terminal 78 and a low output at the X output terminal 80. As shown in FIG. 4, an input signal of 110 will enable transistors 24, transistors 10 and 16, and transistors 72 and 74, and current will flow from $V_{cc}$ source through resistance 84 and through transistors 72, 10 and 24 directly to ground. This lowers the voltage to produce a binary 0 output on the X output terminal 80, while the lack of current conduction through the remaining transistors causes the output terminal 78 to remain at its $V_{cc}$ voltage level indicating a binary 1 output.

It will be noted that current through the circuit passes through only one of the non-critical load resistors 82 or 84 and then directly through one transistor in each of the various levels and directly to ground, thus requiring but a single bias source and bias conductor in the integrated circuit. Thus, the circuitry eliminates the need for the relatively low tolerance resistors such as required by processes employing emitter coupled logic.

FIG. 6 is a logic diagram illustrating four of the three-input exclusive OR/NOR circuits connected to form a nine-bit parity circuit that will produce a high output signal at the odd parity terminal, PO, when an odd number of input signals are high, and will change its output state if any one of the input states is changed. In such a circuit, it may be desirable to utilize a single input terminal for each variable rather than applying both the true and inverted input variable. It will, therefore, be necessary to internally generate inverted states for each variable such as by the circuitry shown in FIG. 2.

What is claimed is:

1. A high-speed exclusive OR/NOR circuit comprising:
   a plurality of NPN transistor pairs arranged in a tree configuration of at least two levels, the first of said pairs being at a first level and having the emitters of each transistor in said pair being connected directly to ground reference, the collector of each transistor in said first pair being connected to the interconnected emitters of a second transistor pair and a third transistor pair in the second level;
   first input signal means coupled to said first transistor pair for selectively enabling the first and disabling the second transistor in said first pair;
   second input signal means coupled to said second and said third transistor pair for selectively enabling the first and disabling the second transistor in each of said second and said third pairs;
   first current source circuitry including a first resistance coupled between a source of D.C. potential and a first conductor intercoupling the collector of the transistor in said second pair enabled by said second input signal means with the transistor in said third pair disabled by said second input signal means;
   second current source circuitry including a second resistance coupled between said source of D.C. potential and a second conductor intercoupling the collector of the transistor in said third pair enabled by said second input signal means with the transistor in said second pair disabled by said input signal means; and
   first output means coupled to said first conductor for signalling current flow from said source of D.C. potential through said first resistance and through enabled transistors to ground potential.

2. The circuit claimed in claim 1 further including second output means coupled to said second conductor for signalling current flow from said source of D.C. potential through said second resistance and through enabled transistors to said ground reference.

3. The circuit claimed in claim 1 in which the transistors in said plurality of transistor pairs are Schottky clamped.

4. The circuit claimed in claim 3 wherein said first input signal means includes an input NPN transistor having an emitter and collector respectively coupled through resistances to said ground reference and to said D.C. potential source, and respectively coupled to the bases of said first and second transistors in said first transistor pair, said input NPN transistor being rendered conductive and non-conductive by the application of high and low input signals respectively whereby said first and second transistors in said first transistor pair are respectively rendered conductive and non-conductive.

5. The circuit claimed in claim 4 wherein said second input signal means includes:
   a second input NPN transistor biased between said D.C. potential source and ground reference for conduction and non-conduction by the respective presence and absence of an applied input signal, the emitter of said second input transistor being coupled to the bases of first and second transistors in said second and third transistor pairs; and
   a multiple-emitter NPN transistor having first and second emitters coupled for conduction respectively through said first and second transistors in said first transistor pair, and a collector coupled to the bases of the first and second transistors in said third and second transistor pairs;

the base of said multiple-emitter transistor being coupled to the emitter of said second input NPN transistor.

6. The circuit claimed in claim 3 further including fourth and fifth transistor pairs interposed between said second and third transistor pairs and said first and second current source circuitry, respectively, each transistor in said fourth and fifth pairs having a plurality of emitters, the first and second emitters of the first and second transistors in each of said pairs being interconnected and to an emitter of a transistor in said second and third pair.

7. The circuit claimed in claim 6 further including third input signal means coupled to said fourth and fifth transistor pairs for selectively enabling the first and disabling the second transistor in each of said pairs, whereby the application of first, second, and third input signals will enable one transistor in said first, said second and third, and said fourth and fifth pairs to provide a mutually exclusive current path from said D.C. potential source and through said enabled transistors to ground reference.

* * * * *